(12) United States Patent
Kang et al.

(10) Patent No.: US 9,733,709 B2
(45) Date of Patent: Aug. 15, 2017

(54) TACTILE DISPLAY DEVICE

(71) Applicant: ELECTRONICS AND TELECOMMUNICATIONS RESEARCH INSTITUTE, Daejeon (KR)

(72) Inventors: Seung Youl Kang, Daejeon (KR); Seungeon Moon, Daejeon (KR); Seongdeok Ahn, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/952,914

(22) Filed: Nov. 25, 2015

(65) Prior Publication Data

US 2016/0154461 A1    Jun. 2, 2016

(30) Foreign Application Priority Data

Nov. 28, 2014    (KR) ........................ 10-2014-0168447

(51) Int. Cl.
*G08B 6/00* (2006.01)
*G09B 21/00* (2006.01)
*H04B 3/36* (2006.01)
*G06F 3/01* (2006.01)
*H01L 41/047* (2006.01)
*H01L 41/193* (2006.01)

(52) U.S. Cl.
CPC ............ *G06F 3/016* (2013.01); *H01L 41/047* (2013.01); *H01L 41/193* (2013.01)

(58) Field of Classification Search
CPC ....... G06F 3/016; H01L 41/18; H01L 41/047; H01L 41/04
See application file for complete search history.

(56) References Cited

U.S. PATENT DOCUMENTS

| | | | |
|---|---|---|---|
| 6,343,129 B1 | 1/2002 | Pelrine et al. | |
| 6,583,533 B2 | 6/2003 | Pelrine et al. | |
| 2009/0301828 A1* | 12/2009 | Fujikura | F16F 1/3605 188/266.7 |
| 2010/0171393 A1* | 7/2010 | Pei | H01L 41/094 310/330 |
| 2013/0004922 A1* | 1/2013 | Takahashi | G06F 3/016 434/113 |
| 2013/0175151 A1 | 7/2013 | Cordoba Matilla | |
| 2013/0175898 A1* | 7/2013 | Brokken | G02B 26/0825 310/300 |

(Continued)

FOREIGN PATENT DOCUMENTS

KR    10-2013-0109027 A    10/2013

OTHER PUBLICATIONS

Ig Mo Koo et al., "Development of Soft-Actuator-Based Wearable Tactile Display", IEEE Transactions on Robotics, vol. 24, No. 3, pp. 549-558, Jun. 2008.

(Continued)

*Primary Examiner* — Erin File
(74) *Attorney, Agent, or Firm* — Rabin & Berdo, P.C.

(57) ABSTRACT

A tactile display device comprises a first electrode, a second electrode, supports between a first and a second electrodes, and an electroactive polymer filled between a supports.

10 Claims, 8 Drawing Sheets

(56) References Cited

U.S. PATENT DOCUMENTS

| | | | |
|---|---|---|---|
| 2014/0015402 A1* | 1/2014 | Ahn | H01L 27/3225 313/511 |
| 2014/0111480 A1 | 4/2014 | Kim et al. | |
| 2015/0162597 A1* | 6/2015 | Grant | C25B 3/10 429/212 |
| 2015/0340195 A1* | 11/2015 | Brodie | H01J 37/045 250/396 R |
| 2015/0349747 A1* | 12/2015 | Burak | H03H 9/173 333/187 |

OTHER PUBLICATIONS

Ron Pelrine et al., "High-Speed Electrically Actuated Elastomers with Strain Greater Than 100%", Science, vol. 287 No. 5454, pp. 836-839, Feb. 4, 2000.

* cited by examiner

TACTILE DISPLAY DEVICE

CROSS-REFERENCE TO RELATED APPLICATIONS

This U.S. non-provisional patent application claims priority under 35 U.S.C. §119 of Korean Patent Application No. 10-2014-0168447, filed on Nov. 28, 2014, the entire contents of which are hereby incorporated by reference.

BACKGROUND

The present disclosure herein relates to a tactile display device, and more particularly, to a tactile display device using an electroactive polymer.

An electroactive polymer (EAP) is a material, which is modified when external voltage is applied thereto, and is now attracting much attention because of many advantages such as weight reduction, slimness, and miniaturization due to an good processability of the polymer material, as well as rapid response rate, large actuation displacement, and low power consumption in operation. The EAP may be applied to haptic phones, haptic mouse, camera modules, flat speakers, and tactile sensors, etc. Further, unlike materials such as metals or ceramics, the EAP has elasticity and strength similar to those of human muscle, so that the EAP is applicable as artificial muscle or biomimetic actuators.

Mostly, EAPs are divided into two groups. That is, an ionic EAP and electronic EAP, wherein, when external voltage is applied, in the ionic EAP, shrink-expansion modification of the polymer occurs due to migration and diffusion of ions, and, in the electronic EAP, modification occurs due to electronic polarization. Examples of the ionic EAP include electrorheological fluids, carbon nanotubes, conducting polymers, ionic polymer-metal composites, and polymer gels, etc. which have various benefits such as high actuation force, rapid response rate, and low applied voltage. Examples of the electronic EAP include liquid crystal elastomers, electro-viscoelastic elastomers, electrostrictive papers, electrostrictive graft elastomers, dielectric elastomers, and ferroelectric polymers, etc. which have benefits such as rapid response rate, and an elaborate displacement modulation.

Among those mentioned above, the dielectric elastomer is beneficial in many aspects in terms of a strain, a rapid response rate, driving force, and energy storage. It may be expected that when the strain is adjusted through voltage, multi-step tactility/texture can be expressed in a thickness direction, however the recognition rate of the step may be greatly declined due to unidirectional expression and changes of entire pixels. Thus, it is required to prepare various surface shapes by an electronic field in order to use the dielectric elastomer in tactility/texture touch screen which may express various texture and tactility.

SUMMARY

The present disclosure provides a tactile display device which effectively provides tactility.

The present disclosure relates to a tactile display device. An embodiment of the inventive concept provides a tactile display device, including a first electrode, a second electrode, supports between the first and the second electrodes, and an electroactive polymer (EAP) filled between the supports.

In an embodiment, the EAP shrinks in a thickness direction by voltage.

In an embodiment, the EAP may include one selected from electrorheological fluids, carbon nanotubes, conducting polymers, ionic polymer-metalcomposites, polymer gels, liquid crystal elastomers, electro-viscoelastic elastomers, electrostrictive papers, electrostrictive graft elastomers, dielectric elastomers, or ferroelectric polymers.

In an embodiment, the dielectric elastomer may include one selected from silicon-based polymers, acrylic-based polymers, or urethane-based polymers.

In an embodiment, the supports may maintain structures despite voltage between the first electrode and the second electrode.

In an embodiment, the supports may include zinc oxide (ZnO) nanorods, or thermal cured or photocured polymers.

In an embodiment, the supports may have a pillar structure, a bead structure or a wall structure.

In an embodiment, the supports having a pillar structure may have heights different from each other.

In an embodiment, the supports having a wall structure may have heights different from each other.

In an embodiment, the first electrode may extend in a first direction, and the second electrode may extend in a second direction crossing the first direction.

In an embodiment, the first and the second electrodes may be modifiable.

In an embodiment, the first and the second electrodes may be one selected from carbon paste, carbon nanotubes, graphenes, metal nano-ink or nanowire ink.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
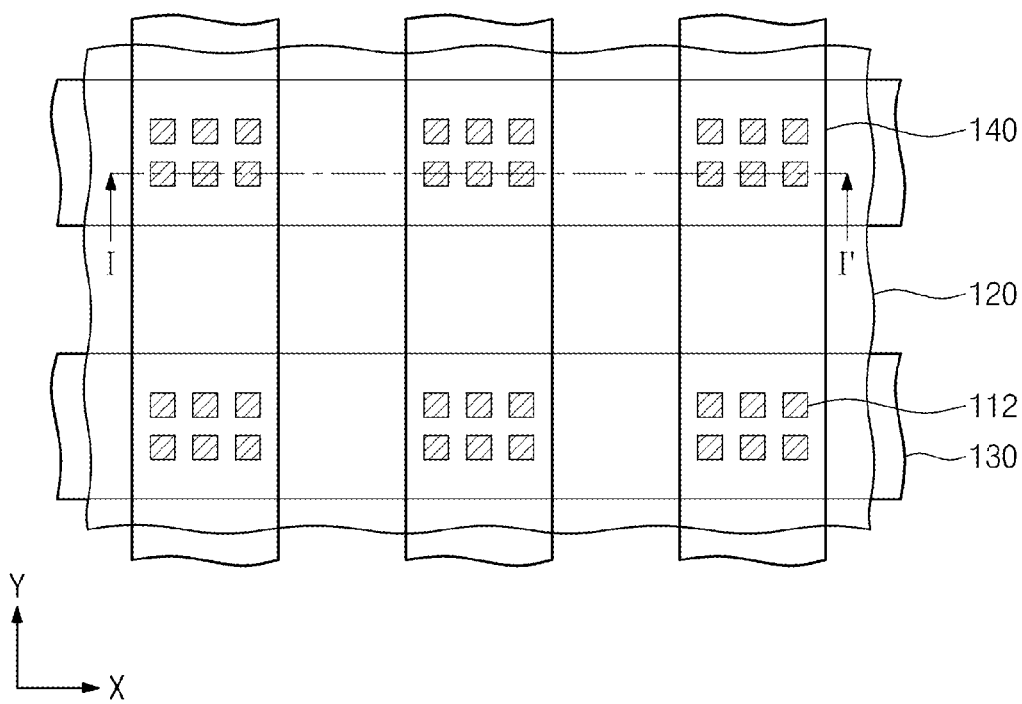
FIG. 1 is a plan view of a tactile display device according to an embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when element is referred to as being 'on' another element, it can be directly on the other element, or intervening elements may also be present. In the drawings, the dimensions of elements are exaggerated for clarity of illustration. Like reference numerals refer to like elements throughout.

Hereinafter, exemplary embodiments of the inventive concept will be described in detail with reference to the accompanying drawings.

The embodiments of the inventive concept will be described with reference to ideal and exemplary sectional views and/or plan views. In the drawings, the dimensions of layers and regions are exaggerated for clarity of illustration. Therefore, the forms of the exemplary drawings may be changed due to manufacturing technology and/or error tolerance. Thus, embodiments of the inventive concept are not limited to depicted certain forms, but include modified forms which are obtained according to the manufacturing process. For example, an etching profile depicted as a right angle may be round or have a certain curvature. Therefore, the exemplar regions on the drawings are just schematic. The shapes of the regions exemplify specific shapes of the regions of elements and do not delimit the scope of the invention. The terms "first", "second", and "third" used in various embodiments herein are used to describe various elements, but the elements should not be delimited by the term. These terms are only used to distinguish an element from other elements. The embodiments described and exemplified herein include complementary embodiments thereof.

The terminology used herein is not for delimiting the present invention but for describing the embodiments. Herein, a singular form may include plural forms unless otherwise specified. The term "comprise" and/or "comprising" used herein does not mean that the mentioned element excludes presence or addition of one or more other elements.

Figure 2:
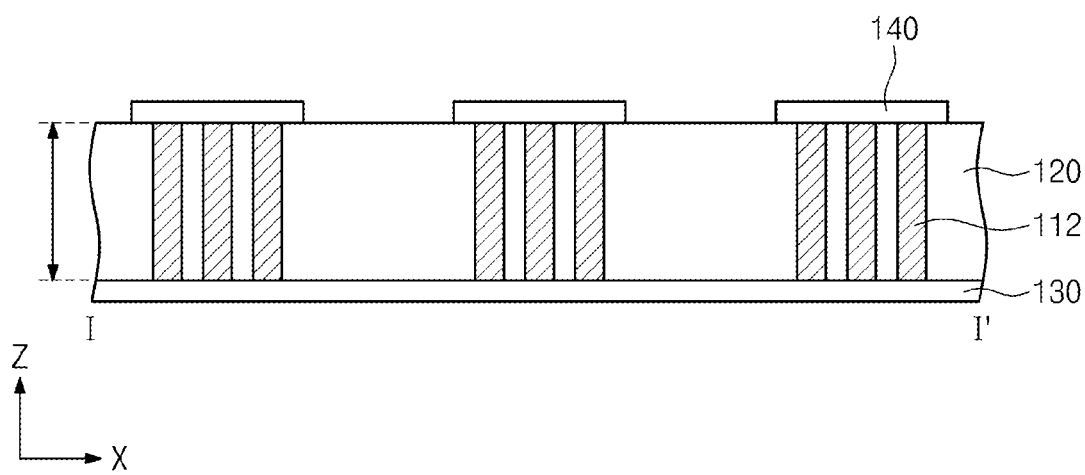
FIGS. 2 and 3 are sectional views taken along line I-I' of FIG. 1 and illustrating operation of the display device according to examples of the inventive concept.
Figure 3:
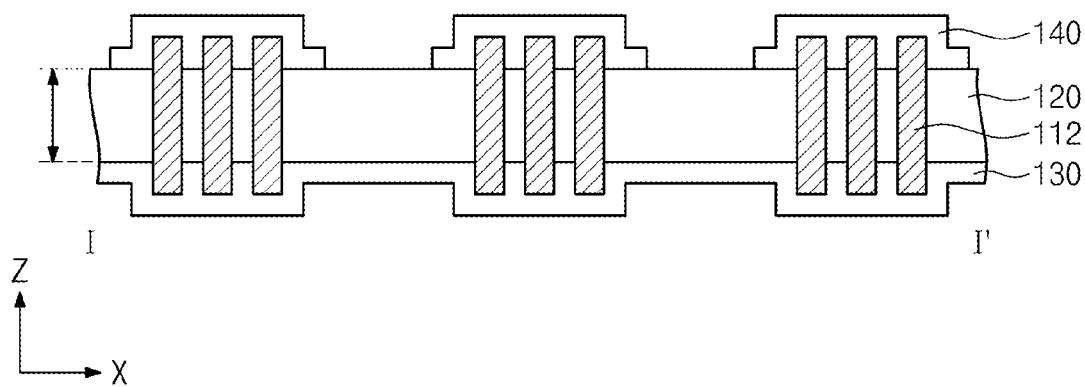

FIG. 1 is a plan view of a tactile display device according to an embodiment of the inventive concept. FIGS. 2 and 3 are sectional views taken along line I-I' of FIG. 1 and illustrating operation of the tactile display device according to an embodiment of the inventive concept. Referring to FIGS. 1 and 2, the tactile display device according to an embodiment of the inventive concept may include a first electrode 130, a second electrode 140, supports 112 between the first electrode 130 and the second electrode 140, and an electroactive polymer (EAP) 120 filled between the supports 112. The first electrode 130 may extend in a first direction (x direction), and the second electrode 140 may extend in a second direction (y direction). The first direction (x direction) may be orthogonal to the second direction (y direction).

The supports 112 may be disposed in a region where the first electrode 130 and the second electrode 140 cross each other. The supports 112 may have a pillar structure. Six supports 112 are depicted in the region where the first electrode 130 and the second electrode 140 cross each other, however the number of supports is not limited thereto. In addition, cross sections of the supports 112 are not limited to a tetragon. Supports 112 may include zinc oxide (ZnO) or a polymer material. The polymer material may be thermocurable or photocurable.

The EAP 120 may include ionic EAP or electronic EAP. The ionic EAP may include electrorheological fluids (ERP), carbon nanotubes (CNT), conducting polymers (CP), ionic polymer-metal composites (IPMC), ionic polymer gels (IPG), etc. The electronic EAP may include liquid crystal elastomers (LCE), electro-viscoelastic elastomers, electrostrictive paper, electrostrictive graft elastomer, dielectric elastomers, and ferroelectric polymers, etc.

The first electrode 130 and the second electrode 140 may be compliant electrodes which may be modified together with EAP. For example, the first electrode 130 and the second electrode 140 may be one selected from carbon paste, carbon nanotubes, graphenes, metal nano-ink, or nanowire ink (such as, silver nanowire ink). Also, the first electrode 130 and the second electrode 140 may be a metal electrode having a wave structure.

FIG. 2 is an I-I' sectional view in the case where external voltage is not applied. FIG. 3 is an I-I' sectional view in the case where external voltage is applied. Referring to FIGS. 2 and 3, when external voltage is applied between the first electrode 130 and the second electrode 140, EAP 120 may shrink. For example, when EAP 120 is a dielectric elastomer, the EAP 120 may shrink in a thickness direction (z direction) in proportion to square of the external voltage level applied between the first electrode 130 and the second electrode 140.

Supports 112 may not be modified by external voltage between the first electrode 130 and the second electrode 140 and shrinkage of EAP 120. Thus, in the region where the supports 112 are disposed, the supports 112 may further protrude outwardly than upper and bottom faces of EAP 120. Since the first electrode 130 and the second electrode 140 are compliant electrodes, the electrodes may be modified according to the protruded shape. Consequently, it is possible to obtain a display device capable of providing tactility/texture when external voltage is applied between the first electrode 130 and the second electrode 140.

Figure 4:
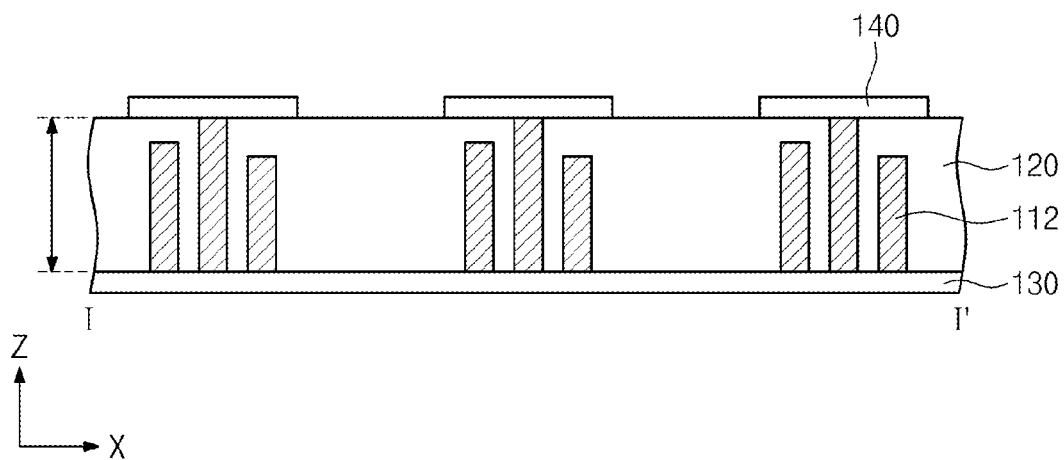
FIGS. 4 and 5 are sectional views taken along line I-I' of FIG. 1 and illustrating operation of the display device according to examples of the inventive concept.
Figure 5:
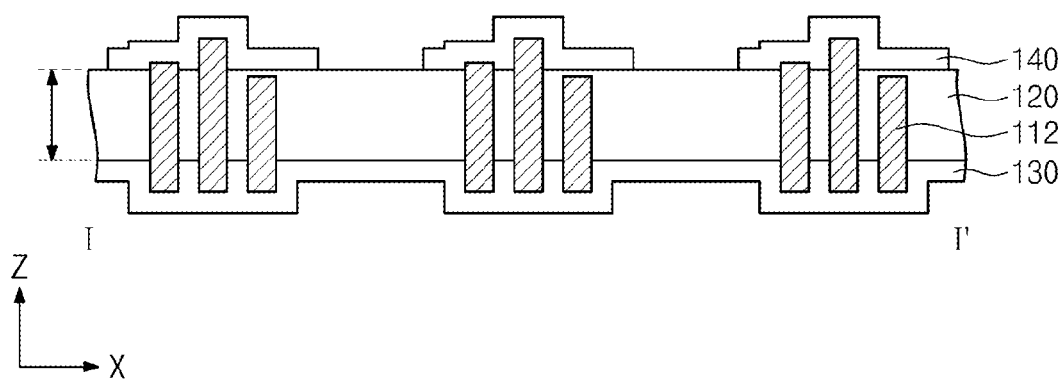

FIGS. 4 and 5 are sectional views taken along line I-I' of FIG. 1 and illustrating operation of a tactile display device according to other embodiment of the inventive concept. Referring to FIGS. 4 and 5, supports 112 may have different heights in a z direction. The supports 112 having different heights may sequentially protrude depending on a degree of shrinkage of EAP 120. Therefore, it is possible to obtain a display device capable of providing multi-step tactility/texture.

Figure 6:
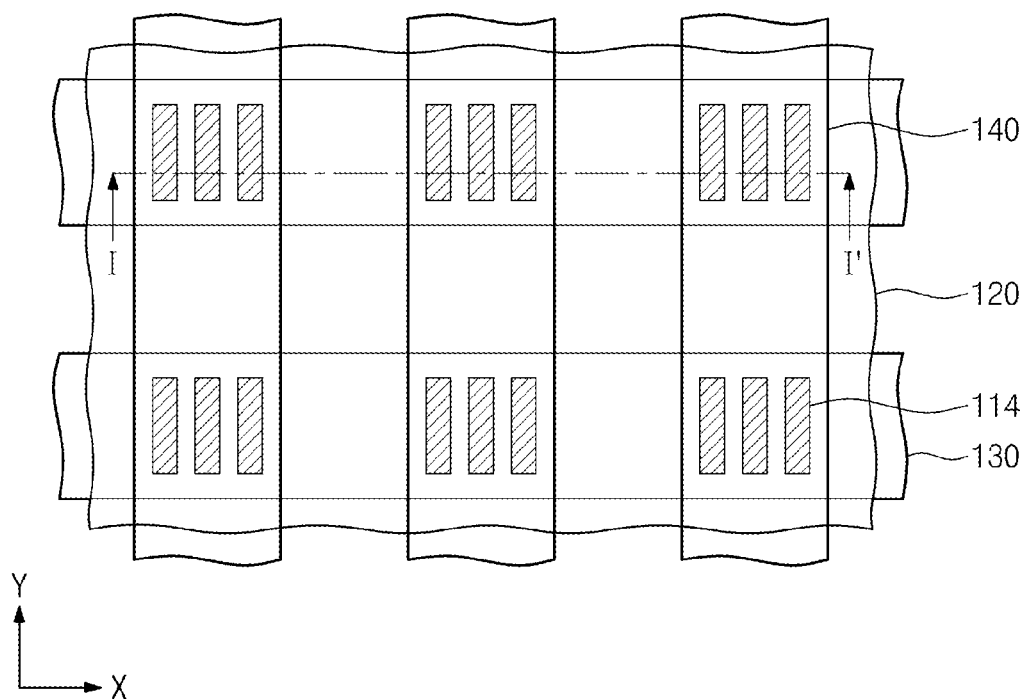
FIG. 6 is a plan view of a tactile display device according to other embodiment of the inventive concept.

FIG. 6 is a plan view of a tactile display device according to another embodiment of the inventive concept. FIGS. 2 to 5 are sectional views taken along line I-I' of FIG. 6 and illustrating operation of the tactile display device according to another embodiment of the inventive concept. A first electrode 130, a second electrode 140, and EAP 120 may be same as the first electrode 130, the second electrode 140 and EAP 120 of FIGS. 1 to 5 described above.

Referring to FIGS. 6 and 2, supports 114 may be disposed in a region where the first electrode 130 and the second electrode 140 cross each other. The supports 114 may have a wall structure. Three supports 114 are depicted in the region where the first electrode 130 and the second electrode 140 cross, however the number of supports 114 is not limited thereto. Cross sections of the supports 114 are not limited to tetragon. The supports 114 may include Zinc Oxide (ZnO) or a polymer material. The polymer material may be thermocurable or photocurable.

Referring to FIGS. 6 and 3, when external voltage is applied between the first electrode 130 and the second electrode 140, EAP 120 may shrink in a thickness direction (z direction). The supports 114 may not be modified by external voltage between the first electrode 130 and the second electrode 140 and shrinkage of EAP 120. Thus, the region where the supports 114 are disposed may protrude outwardly than upper and bottom faces of EAP 120. Since the first electrode 130 and the second electrode 140 are compliant electrodes, the first and the second electrode may be modified according to the protruded shape. Consequently, it is possible to obtain a tactile display device capable of providing tactility/texture when external voltage is applied.

Referring to FIGS. 4, 5 and 6, supports 114 may have different heights in the z direction. The supports 114 having different heights may sequentially protrude depending on a degree of shrinkage of EAP 120. Therefore, it is possible to obtain a tactile display device capable of providing multi-step tactility/texture.

Figure 7:
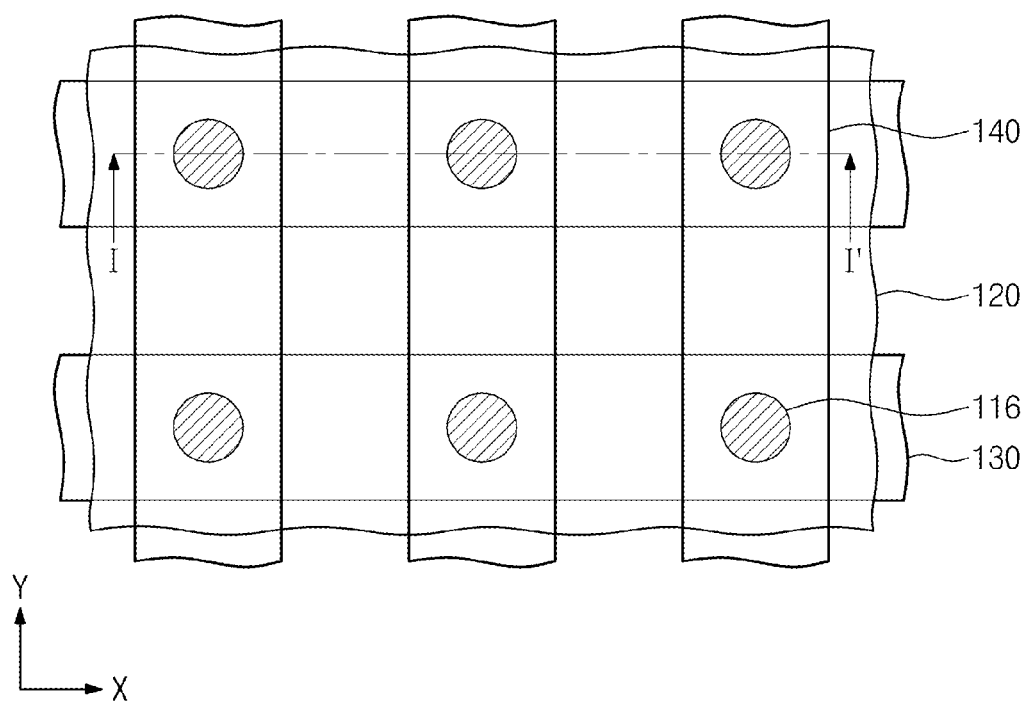
FIG. 7 is a plan view of a tactile display device according to another embodiment of the inventive concept.
Figure 8:
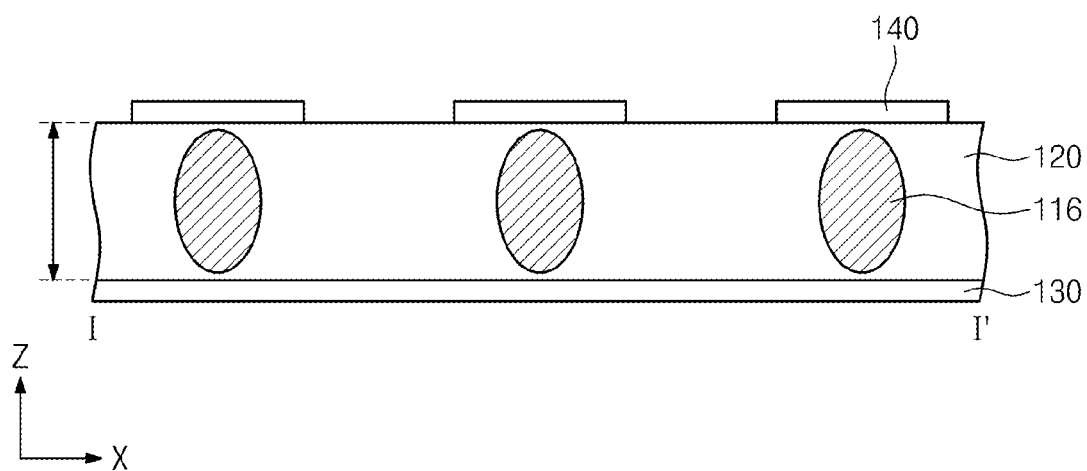
FIGS. 8 and 9 are sectional views taken along line I-I' of FIG. 7 and illustrating operation of the display device according to examples of the inventive concept.
Figure 9:
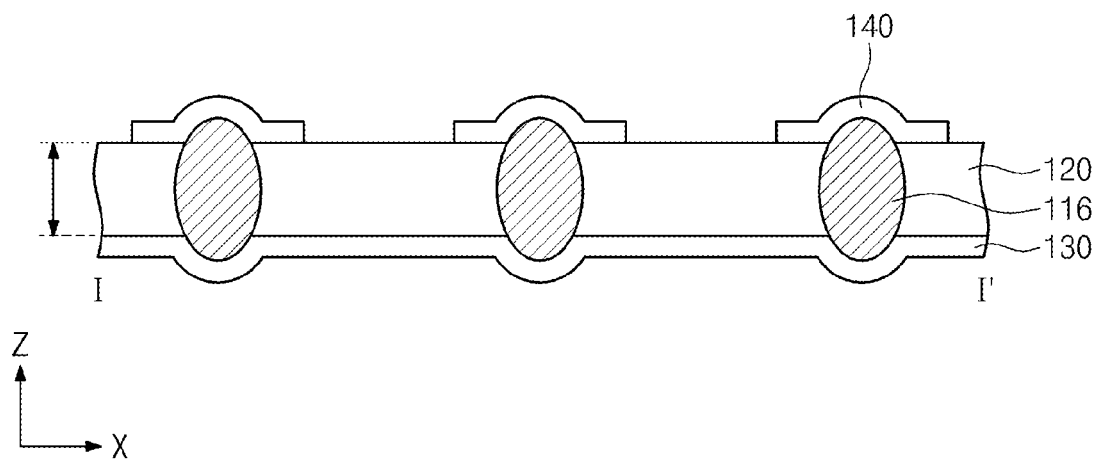

FIG. 7 is a plan view of a tactile display device according to another embodiment of the inventive concept. FIGS. 8 to 9 are sectional views taken along line I-I' of FIG. 7 and illustrating operation of the tactile display device according to another embodiment of the inventive concept. Referring to FIGS. 7 and 8, supports 116 may be disposed on a region where a first electrode 130 and a second electrode 140 cross each other. The supports 116 may have a bead structure. One support 116 is depicted in the region where the first electrode 130 and the second electrode 140 cross, however the number of supports is not limited thereto. The supports 116 may include Zinc Oxide (ZnO) or a polymer material. The polymer material may be thermocurable or photocurable.

FIG. 8 is a sectional view when external voltage is not applied. FIG. 9 is a sectional view when external voltage is applied. Referring to FIG. 9, when external voltage is applied between the first electrode 130 and the second electrode 140, EAP 120 may shrink in a thickness direction (z direction). The supports 116 may not be modified by external voltage between the first electrode 130 and the second electrode 140 and shrinkage of EAP 120. Thus, the region where the supports 116 are disposed may protrude outwardly than upper and bottom faces of EAP 120. Since the first electrode 130 and the second electrode 140 are compliant electrodes, the first and the second electrodes may be modified according to the protruded shape. Consequently, it is possible to obtain a display device capable of providing tactility/texture when external voltage is applied.

FIGS. 10 through 13 are sectional views taken along line I-I' of FIG. 1 and illustrating a manufacturing process of a tactile display device according to an embodiment of the inventive concept.

Figure 10:
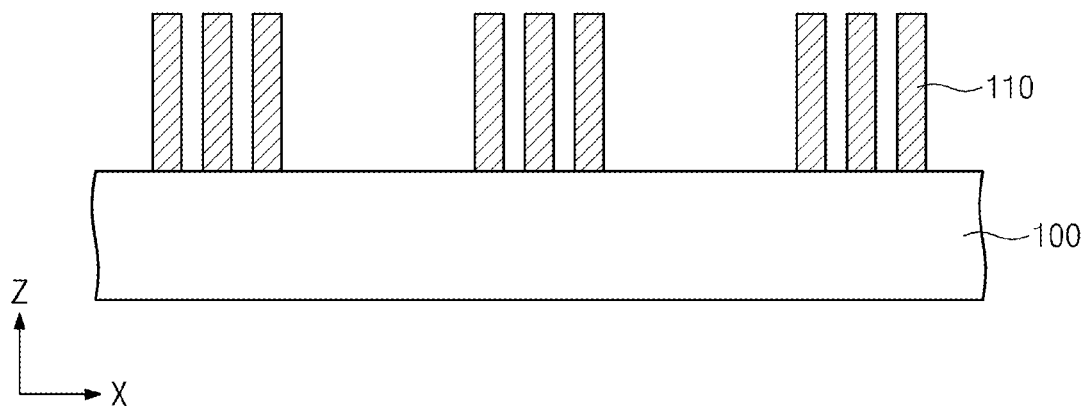
FIGS. 10 through 13 are sectional views taken along line I-I' of FIG. 1 and illustrating a manufacturing process of the tactile display device according to an embodiment of the inventive concept.

Referring to FIG. 10, a substrate 100 is provided. The substrate may be glass, quartz, or plastic substrate or polymer film.

Supports 110 may be disposed on the substrate 100 in perpendicular (z direction) to a surface of the substrate 100. The supports 110 may not be modified by voltage. For example, the supports 110 may include Zinc Oxide (ZnO). The supports 110 including Zinc Oxide (ZnO) may be easily formed at a low temperature. Sizes of the supports 110 including Zinc Oxide (ZnO) may be adjusted by concentration of a precursor, and temperature, etc. Also, the supports 110 may grow to have a desired shape and at desired position by use of a photoresist. For example, a photoresist is used to determine a position, and then the supports 110 may grow to have a desired shape. In other embodiment, a support layer (not shown) grows firstly, and then the supports 110 may be disposed on the desired position by use of a photoresist. In other embodiment, the supports 110 may be thermocurable or photocurable polymer materials. Patterning may be performed on the thermocurable or photocurable polymer material by use of a photo mask to have a desired shape. Generally, when the polymer material is thermal cured or photocured, modification due to voltage may not occur. In other embodiment, the supports 110 may be formed by using a 3D printing process. In that case, the supports 110 are more easily formed to have a desired shape and at a desired position. In particular, the 3D printing process may be suitable for formation of the supports 110 having different heights.

The supports 110 may have a pillar structure 112, a wall structure 114, or a bead structure 116, etc. Each of the supports having a pillar structure 112, each of supports having a wall structure 114, or each of supports having a bead structure 116 may have a height different from each other.

Figure 11:
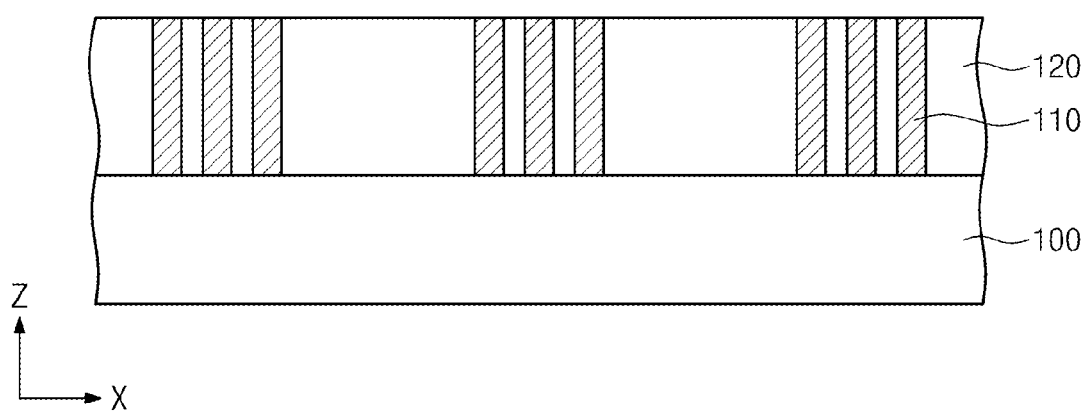

Referring to FIG. 11, EAP 120 may be provided to fill between the supports 110. The upper face of the EAP 120 may have the same height as the upper face of the supports 110. In other embodiment, the upper face of the EAP 120 may be higher than the upper face of the supports 110. The EAP 120 may have a thickness of 10 micrometers to 500 micrometers, but not limited thereto. The EAP may be modified in a thickness direction when external voltage is applied. The EAP 120 may be proved through drop casting, spin casting, or doctor blade, etc. The EAP 120 may include ionic EAP or electronic EAP. The ionic EAP may include ERP, CNT, CP, IPMC, and IPG, etc. The electronic EAP may include LCE, electro-viscoelastic elastomers, electrostrictive papers, electrostrictive graft elastomers, dielectric elastomers, and ferroelectric polymers, etc.

In an embodiment, EAP 120 may be a dielectric elastomer. The dielectric elastomer may have a thickness of 10 micrometers to 500 micrometers, but not limited thereto. The dielectric elastomer may shrink in a thickness direction (z direction) by external voltage. A degree of shrinkage may be proportional to square of the applied external voltage level. The dielectric elastomer may include silicone-based polymers, acrylic-based polymers, or urethane-based polymers.

Figure 12:
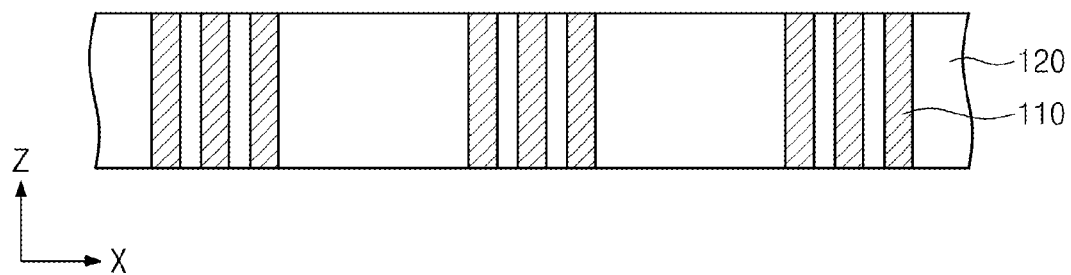

Referring to FIG. 12, EAP 120 and supports 110 may be separated from the substrate 100 by a physical method (for example, a method of applying a force to a direction to be separated). The separated EAP 120 may be cured (or hardened) (not shown). The curing (not shown) process may include thermocuring or photocuring.

Figure 13:
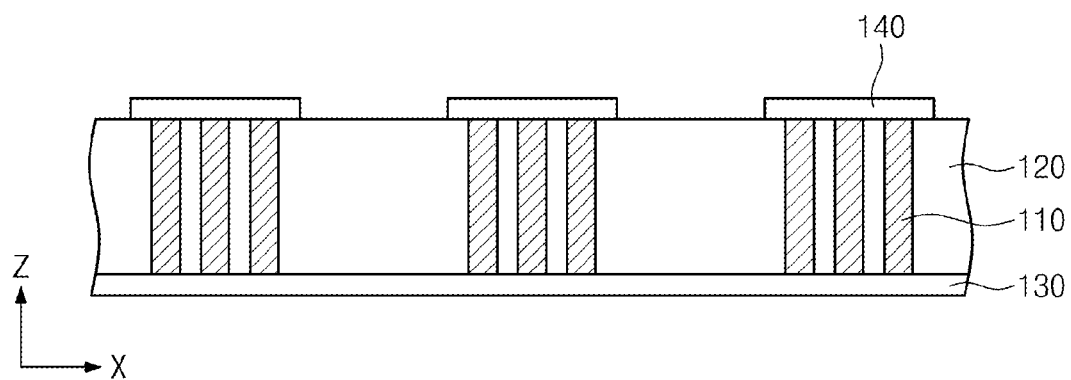

Referring FIGS. 1 and 13, a first electrode 130 may be formed on a bottom face of EAP 120. The first electrode 130 may extend in a first direction (x direction). On an upper face of the EAP 120, the second electrode 140 may be formed. The second electrode 140 may extend in a second direction (y direction) crossing the first direction. The first electrode 130 and the second electrode 140 may be formed by vacuum deposition, sputter, electron beam method or decalcomania method, etc. Preferably, the first electrode 130 and the second electrode 140 may be formed by decalcomania method.

The first electrode 130 and the second electrode 140 may be modified. For example, the electrode may be a compliant electrode which is modified together with EAP. The first electrode 130 and the second electrode 140 may be one selected from carbon paste, carbon nanotubes, graphenes, metal nano-ink, or nanowire ink (such as, silver nanowire ink). Also, the first electrode 130 and the second electrode 140 may be a metal electrode having a wave structure.

According to the inventive concept, provided is the tactile display device having enhanced performance.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A tactile display device, comprising:
a first electrode and a second electrode for receiving a voltage;
a plurality of supports disposed between the first and second electrodes, the supports being so configured as to be free of deformation regardless of the voltage applied through the first and second electrodes; and
an electroactive polymer filled between the supports, the electroactive polymer being configured to shrink in a thickness direction in response to the voltage applied through the first and second electrodes, wherein
the plurality of supports are parallel to one another, and are configured to protrude from a bottom surface of the electroactive polymer when the voltage is applied to the first and second electrodes, and
the first and second electrodes are perpendicular to the plurality of supports.

2. The device of claim 1, wherein the electroactive polymer comprises one selected from electrorheological fluids, carbon nanotubes, conducting polymers, ionic polymer-metal composites, polymer gels, liquid crystal elastomers, electro-viscoelastic elastomers, electrostrictive papers, electrostrictive graft elastomers, dielectric elastomers, or ferroelectric polymers.

3. The device of claim 2, wherein the dielectric elastomer comprises one selected from silicone-based polymers, acrylic-based polymers, or urethane-based polymers.

4. The device of claim 1, wherein the supports comprise zinc oxide (ZnO) nanorods, or thermalcured or photocured polymers.

5. The device of claim 1, wherein the supports have a pillar structure, a bead structure or a wall structure.

6. The device of claim 5, wherein the supports having a pillar structure have heights different from each other.

7. The device of claim 5, wherein the supports having a wall structure have heights different from each other.

8. The device of claim 1, wherein the first electrode extends in a first direction, and the second electrode extends in a second direction crossing the first direction.

9. The device of claim 1, wherein the first and the second electrodes are modifiable.

10. The device of claim 9, wherein the first and the second electrodes are one selected from carbon paste, carbon nanotubes, graphenes, metal nano-ink or nanowire ink.

* * * * *